(12) United States Patent
Hengl et al.

(10) Patent No.: US 10,020,805 B2
(45) Date of Patent: Jul. 10, 2018

(54) BIDIRECTIONAL MOSFET SWITCH AND MULTIPLEXER

(71) Applicant: WEETECH GmbH, Wertheim (DE)

(72) Inventors: Rudi Hengl, Wertheim (DE); Christian Reuter, Wertheim/Mohnfeld (DE)

(73) Assignee: Weetech GmbH, Wertheim (DE)

( * ) Notice: Subject to any disclaimer, the term of this patent is extended or adjusted under 35 U.S.C. 154(b) by 215 days.

(21) Appl. No.: 15/179,502

(22) Filed: Jun. 10, 2016

(65) Prior Publication Data

US 2016/0365854 A1 Dec. 15, 2016

(30) Foreign Application Priority Data

Jun. 10, 2015 (DE) .................. 10 2015 109 167

(51) Int. Cl.
| | |
|---|---|
| *H03K 17/687* | (2006.01) |
| *H03K 17/693* | (2006.01) |
| *H03K 17/689* | (2006.01) |
| *H03K 17/0412* | (2006.01) |

(52) U.S. Cl.
CPC ..... *H03K 17/693* (2013.01); *H03K 17/04123* (2013.01); *H03K 17/689* (2013.01); *H03K 17/6874* (2013.01); *H03K 17/6877* (2013.01); *H03K 2017/6875* (2013.01); *H03K 2217/0054* (2013.01)

(58) Field of Classification Search
None
See application file for complete search history.

(56) References Cited

U.S. PATENT DOCUMENTS

| | | | |
|---|---|---|---|
| 3,532,899 A * | 10/1970 | Wolterman | H03K 17/04 327/389 |
| 4,595,847 A | 6/1986 | Weir | |
| 4,808,859 A * | 2/1989 | Even-or | H03K 17/162 327/382 |
| 5,138,177 A | 8/1992 | Morgan et al. | |
| 5,221,847 A * | 6/1993 | Ziemer | H03K 17/04123 250/551 |
| 5,298,817 A | 3/1994 | Banak et al. | |
| (Continued) | | | |

FOREIGN PATENT DOCUMENTS

WO 2011114948 A1 9/2011

*Primary Examiner* — Tuan T Lam
(74) *Attorney, Agent, or Firm* — Ewers & Hasselmann PLLC

(57) ABSTRACT

A bidirectional MOSFET switch is provided. The switch includes an input terminal, an output terminal and two MOSFET transistors which are connected to one another by their source and gate terminals. The input and the output terminals are connected to a respective drain terminal of the two MOSFET transistors. The switch further includes a control input terminal that is galvanically isolated by a potential isolator and connected to a control unit configured to switch a control current for a FET transistor via a further MOSFET transistor. The FET transistor is configured to generate, by the control current, a gate voltage Vgs between the gate and the source at the two MOSFET transistors for the switching thereof, and a floating voltage source, which is galvanically connected to the input and which is configured to generate a gate control current for the two MOSFET transistors.

14 Claims, 3 Drawing Sheets

(56) References Cited

U.S. PATENT DOCUMENTS

| | | | | |
|---|---|---|---|---|
| 5,360,979 | A * | 11/1994 | Joseph | H03K 17/04123 250/551 |
| 5,559,466 | A * | 9/1996 | Okumura | H03K 17/6874 250/214 SW |
| 6,522,514 | B1 * | 2/2003 | Torazawa | H03K 17/04123 361/103 |
| 2003/0107322 | A1 * | 6/2003 | Melvin | B64D 47/04 315/82 |
| 2008/0012623 | A1 * | 1/2008 | Oster | G05B 9/02 327/379 |
| 2011/0267132 | A1 * | 11/2011 | Lubomirsky | H01L 29/8083 327/430 |
| 2011/0292556 | A1 * | 12/2011 | Britz | H03K 17/0822 361/91.5 |

* cited by examiner

Related Art

BIDIRECTIONAL MOSFET SWITCH AND MULTIPLEXER

CROSS REFERENCE TO RELATED APPLICATION

This application claims priority of German patent application no. 10 2015 109 167.4, filed Jun. 10, 2015, the entire content of which is incorporated herein by reference.

FIELD OF THE INVENTION

The invention relates to a bidirectional MOSFET switch and a multiplexer including at least two bidirectional MOSFET switches.

BACKGROUND OF THE INVENTION

The present circuit topology is based on an already known MOSFET circuit topology for bidirectional signal interconnection that is also referred to as "common source" and that is illustrated in FIG. 1.

In order to switch the transistors to a conductive or "on" state, a control current is necessary which generates the required gate-source voltage across the resistor R1 and charges the input capacitances of the two gates T1 and T2. If this control voltage is galvanically coupled to the signal voltage, it must be greater or less than the signal voltage depending on MOSFET types used (N- or P-channel), within the scope of the transistor specification, in order to switch T1 and T2 to the on state. This may be technically difficult in the case of high-voltage signals. What is also disadvantageous is that the control current can be superposed with the signal current and flows via the terminals A or B to the opposite potential. As a result, this circuit variant is unfavorable for an interconnection of measurement voltage signals.

Therefore, the control current is often generated photovoltaically (see FIG. 2), which firstly provides for the galvanic isolation for the purpose of driving, and secondly prevents the control current from being superposed with the signal current. What is disadvantageous here is that the driving of the gates of T1 and T2 requires a relatively high control current which must primarily first of all supply the light emitting diode LED1. The control current generated on the secondary side, for example, from a photo diode D1, is relatively small, which is an obstacle to rapidly switching on T1 and T2.

If this type of switch is required multiple times, for example in an implementation of a multiplexer, this type of galvanically isolated driving has to be realized individually for each transistor pair. This is technically complex.

In test engineering and metrology, for example for automated connection testers, signal voltages and currents need to be connected by a switching matrix which consists of up to several thousand individual switches and has to interconnect currents that are well up to the amperes range and voltages of up to a few kilovolts. If the signal voltage is a dangerous contact voltage, for safety reasons, the requirements for air clearances, creepage paths, and insulation from the respectively relevant safety standard (for example, IEC60950, IEC61010 et cetera) must be complied with for each driving, in order to reliably isolate driving and switches from one another. The large distances, owing to the mixed construction of switching element, on the one hand, and drive lines, on the other hand, which must also be insulated from the other switching elements of the matrix, make it more difficult to implement the construction with a high packing density, which makes the construction more expensive, or causes the construction to become larger.

A further alternative for galvanic isolation in relation to the photovoltaic driving is capacitive driving, by two small capacitors. However, the latter can only transmit AC signals, which then ultimately have to be rectified again in order to supply the required gate-source voltage for T1 and T2.

Furthermore, the complex, expensive alternative of driving by a transformer is known. Here as well, only AC signals can be transmitted, which then have to be rectified on the secondary side.

The galvanic isolation during driving prevents the drive current from being superposed with the current to be interconnected and allows the drive voltage to be able to have a different potential than the signal voltage. A technical difficulty is posed here by the energy to be transmitted, which has to be transmitted as efficiently as possible via the galvanic isolation in order to charge the gates of the two transistors T1 and T2, in order that the latter can switch into the on state rapidly enough. In conventional driving by photovoltaics, a relatively large amount of energy is required in order to compensate for the losses of the LED-receiver diode coupling section, which would lead to high power losses in the case of a multiplexer arrangement having many switches.

SUMMARY OF THE INVENTION

An object of the invention is to improve a bidirectional MOSFET circuit topology.

This object is achieved by providing a bidirectional MOSFET switch, the bidirectional MOSFET switch including: a first MOSFET transistor having a first source terminal, a first gate terminal and a first drain terminal; a second MOSFET transistor having a second source terminal, a second gate terminal and a second drain terminal; the first and second MOSFET transistors being connected to one another via the first and second source terminals and via the first and second gate terminals; an input terminal connected to the first drain terminal of the first MOSFET transistor; an output terminal connected to the second drain terminal of the second MOSFET transistor; a control unit; a potential isolator; a control input terminal connected to the control unit via the potential isolator; the potential isolator being configured to galvanically isolate the control input terminal from the control unit; a third FET transistor configured to generate, depending on a control current, a gate voltage Vgs between the first and second gate terminals and the first and second source terminals to switch the first and second MOSFET transistors; a fourth MOSFET transistor; the control unit being configured to switch the control current for the third FET transistor via the fourth MOSFET transistor; and, a floating voltage source galvanically connected to the input terminal and configured to generate a gate control current for the first and second MOSFET transistors.

The bidirectional MOSFET switch according to an aspect of the invention has an input and an output and two MOSFET transistors, which are connected to one another by their source and gate terminals, wherein the input and the output are connected to a respective drain terminal of the two MOSFET transistors. The bidirectional MOSFET switch includes a control input that is galvanically isolated by a potential isolator, the control input being connected to a control unit configured to switch a control current for a FET transistor via a further MOSFET transistor, the FET transistor being configured to generate, by the control current, a gate voltage Vgs between gate and source at the two MOSFET transistors for the switching thereof, and a floating voltage source, which is galvanically connected to the input and is configured to generate a gate control current for the two MOSFET transistors.

The bidirectional MOSFET switch according to an aspect of the invention has the advantage that even for AC voltage signals a low control current is sufficient for the circuit topology.

The FET transistor may be configured to convert the control current into a gate-source voltage, by a current saturation and a high-resistance state brought about thereby, in order to switch on the two MOSFET transistors. The control current is limited by the FET transistor by virtue of the latter attaining saturation. It then constitutes a high-resistance constant-current source. In this regard, an increased switch-on current flows only momentarily until the gates of T1 and T2 are charged.

The FET transistor in a state in which a control current does not flow through may be configured to connect the gates of the two MOSFET transistors to the source of the two MOSFET transistors at low resistance, in order to switch off the two MOSFET transistors. The low resistance of the FET transistor has the advantage that when interconnecting AC signals, only correspondingly small RC elements with the parasitic capacitances of T1 and T2 are formed and, as a result, the leakage current behavior is improved by virtue of the fact that the gate voltages Vgs of T1 and T2 can be kept below the transistor threshold voltage more reliably.

The floating voltage source or floating voltage supply may be galvanically connected to one of the two drain terminals of the two MOSFET transistors. This allows a simple realization of the supply for the control unit. The floating voltage source may be on a secondary side of a DC/DC converter, a battery or a voltage generated by a generator, for example by an energy harvester or a solar cell.

The floating voltage source may be the voltage and/or current supply for the control unit, which simplifies the circuit construction.

The floating voltage source may be configured to generate the control current in order to control the FET transistor at high resistance and to charge the gate capacitances of the two MOSFET transistors. In this regard, an increased switch-on current flows only momentarily until the gates of T1 and T2 are charged. As a result, the transistors T1 and T2 are switched into the on state more rapidly.

The control unit may be configured to store the switching state of the further MOSFET transistor. In the simplest case, the control unit may be a flip-flop that stores the switching state of the analog switch. This allows simple bidirectional switching.

The further MOSFET transistor may be configured to switch the gate control current of the floating voltage source depending on the stored switching state of the control unit. This allows simple bidirectional switching.

The two MOSFET transistors may be N-channel types and the floating voltage source may be connected by its negative potential to the drain terminal of one of the two MOSFET transistors, or the two MOSFET transistors may be P-channel types and the floating voltage source may be connected by its positive potential to the drain terminal of one of the two MOSFET transistors. In this way, the circuit may be realized in a simple manner for both types of transistors.

The further MOSFET transistor may be of the P-channel type if the two MOSFET transistors are N-channel types, or the further MOSFET transistor is of the N-channel type if the two MOSFET transistors are P-channel types. In this way, the circuit may be realized in a simple manner for both types of transistors.

The multiplexer according to an aspect of the invention includes at least two bidirectional MOSFET switches as described above, wherein a potential isolator and a floating voltage source are conjointly provided for all of the bidirectional MOSFET switches. The multiplexer according to an aspect of the invention has the advantage that even for AC voltage signals a low control current is sufficient for the circuit topology, which allows a high scalability in the case of multiplexers, in particular for switching matrices.

BRIEF DESCRIPTION OF THE DRAWINGS

The invention will now be described with reference to the drawings wherein.

DESCRIPTION OF THE PREFERRED EMBODIMENTS OF THE INVENTION

Figure 1:
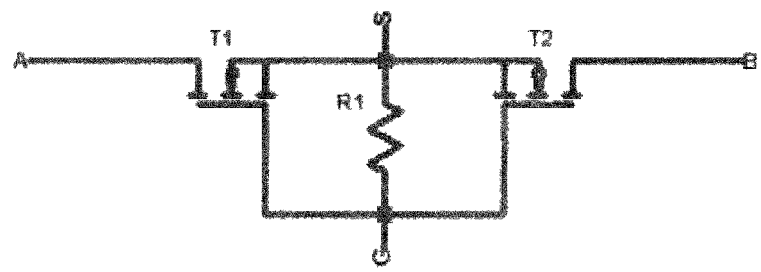
FIG. 1 shows a bidirectional MOSFET switch in the related art.
Figure 2:
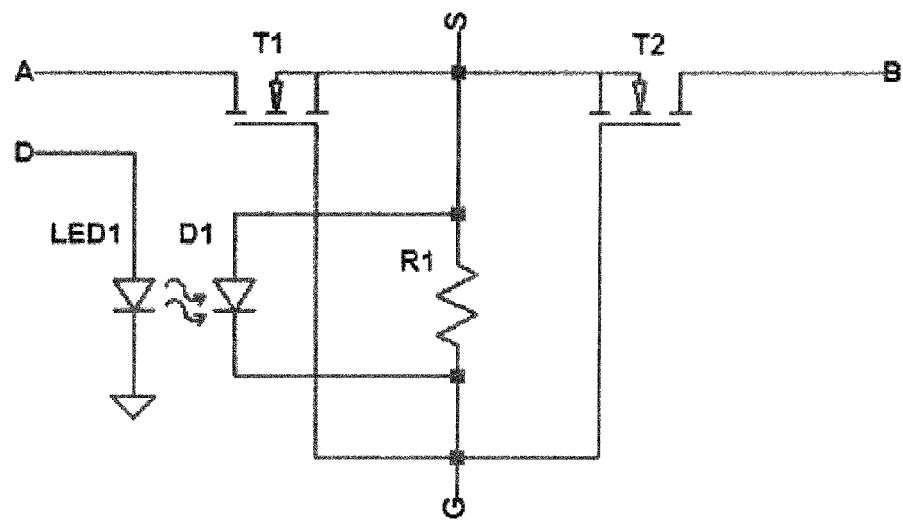
FIG. 2 shows a bidirectional MOSFET switch with photovoltaically generated control current in the related art.
Figure 3:
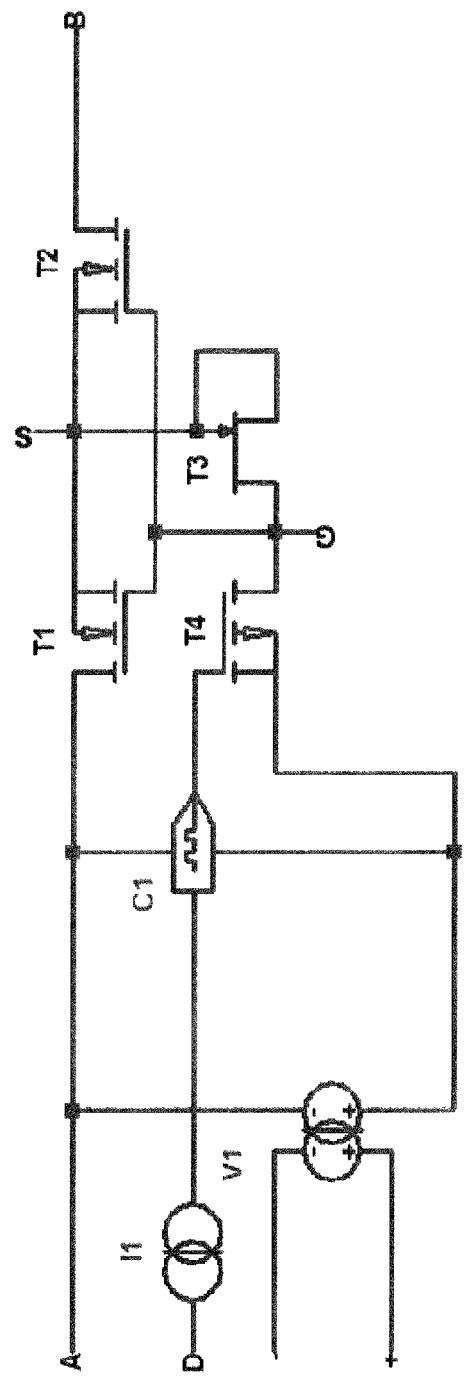
FIG. 3 shows a bidirectional MOSFET switch in accordance with an exemplary embodiment of the invention.

FIG. 3 shows a bidirectional MOSFET switch or a circuit topology including two MOSFET transistors T1 and T2 according to a first exemplary embodiment of the invention. The two MOSFET transistors T1 and T2 are connected to one another by their source terminals S and gate terminals G and form the actual bidirectional switching element. The otherwise customary gate-source resistor is replaced by a FET transistor T3 having a low "pinch off" voltage. The FET transistor T3 is connected to the source of the two MOSFET transistors T1 and T2 by its gate terminal and is source terminal. The drain terminal is connected to the gate of the two MOSFET transistors T1 and T2.

If no drive current flows, the FET transistor T3 represents a relatively low-resistance connection which connects the gate terminals to the source terminals of T1 and T2. In this regard, the gates are discharged and the two transistors T1 and T2 are switched into the off state. A resistor having a high resistance that is otherwise used in order to keep the control current low, would constitute a disadvantage when interconnecting AC signals since it forms an RC element with the parasitic capacitances of T1 and T2. This would disadvantageously influence the leakage current behavior of T1 and T2 in that, in the case of fast potential shifts at the source S, the potential at gate G can no longer be compensated for by the source S. This could have the effect that T1 and T2 possibly already become somewhat conducting as a result of the gate voltage Vgs produced. Furthermore, a resistor having a high resistance leads to slower switch-off times of T1 and T2.

The disadvantages mentioned above are avoided by the use of the FET transistor T3. Depending on the polarity of the signal voltage it may happen that although one of the two "body" diodes of T1 or T2 conducts, one of the two transistors T1 or T2 is also always switched in the reverse direction, which ensures that the switch is in the off state independent from the polarity.

The circuit topology according to an exemplary embodiment of the invention includes a further circuit part in order to switch the two transistors T1 and T2 into the on state. A "floating" voltage supply source V1 is galvanically connected to an input A of the circuit on the secondary side. This constitutes the supply for a control unit or driving unit C1, which in the simplest case is a flip-flop acting as a switching state storage unit. Furthermore, the drain terminal of the transistor T1 is connected to the input A. The drain terminal of the transistor T2 is connected to an output B of the circuit.

The input of the control unit C1 is connected to a drive line or a drive bus D of the circuit in which a potential isolator I1 is provided. The output of the control unit C1 drives a further MOSFET switching transistor T4. If D is a drive bus, the decoding of the drive signal for T4 is also performed in the control unit C1. If T4 is switched on, the source V1 drives a control current via T4 to the FET T3. The control current is limited by the FET T3 by virtue of the latter attaining saturation and then constituting a high-resistance constant-current source. As a result, a switch-on current that is higher than the constant current established by the FET T3 flows only momentarily at the switch-on instant until the gates of T1 and T2 are charged. The potential isolation I1 ensures that the control current flows only in the circuit V1, T4, T3, and T1.

As a result, the transistors T1 and T2 are switched into the on state more rapidly. This, and the drive current that is limited in a controlled manner, constitute an advantage of this circuit in order to keep down the control current power loss and the switching power loss of T1 and T2. Via the "body" diode of T1, the control current can always flow back to the source V1 even in the off state of T1, as a result of which T1 and T2 can always be driven by the control current, independent from the potential at source S. A further advantage of this circuit topology is the fact that the control current can flow from the floating source V1 only in the circuit V1, T4, T3, and T1, and cannot flow via the terminals A or B and, consequently, outside the terminals A and B, it is not superposed with the signal current.

All components in these circuits mentioned above only have to have a sufficiently high functional isolation with regard to the signal voltage level, and this is significantly easier to realize than a safety-relevant isolation with respect to the drive lines for dangerous contact voltages. In FIG. 3, the transistors T1 and T2 are embodied as normally off N-channel MOSFET transistors, while the transistor T4 is embodied as a normally off P-channel MOSFET transistor.

Figure 4:
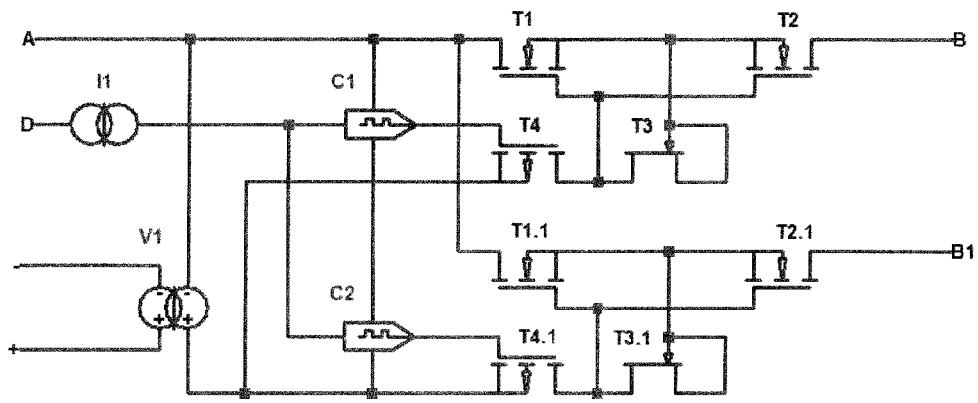
FIG. 4 shows a multiplexer in accordance with an exemplary embodiment of the invention.

FIG. 4 illustrates a circuit topology of a multiplexer, more precisely of a 1:2 multiplexer. Accordingly, two bidirectional MOSFET switches shown in FIG. 3 are provided, which are connected to the input A in parallel and produce two outputs B and B1.

Advantageously, the potential isolator I1 is realized centrally for both driving units C1 and C2 and for the voltage source V1, for example a DC/DC converter. This constitutes a significant technical simplification with regard to the demand of air clearances and creepage paths, insulation, number of components and packing density. This is the case in particular for multiplexers having a large number of individual switches such as, for example, 1:1000 multiplexers.

The drive line D and the supply voltage V1 can be isolated from the signal voltage centrally outside the region of a circuit board, separately from the region of the interconnection of the signal voltage. Within the "switching region", as a result of the galvanic coupling to terminal A, they have the same potential, or only a potential that is different as a result of the secondary-side voltage of V1, with respect to the signal voltage at A, as a result of which the isolation requirements relative to A are only very low. This increases the packing density of such a switching matrix or makes it functionally more reliable since no voltage flashovers from the potential at A to the drive electronics C can occur.

For driving the circuit at D, only a low power is required since the latter no longer has to directly drive the gates of T1 and T2. As a result, the technical implementation is simplified and the drive power can be reduced.

The potential isolator I1 ensures that the control current flows only in the circuit V1, T4, T3, and T1. By virtue of the fact that the potential isolator in a multiplexer arrangement is not needed for each individual switch (in the extreme case only once per multiplexer) and the signal power is low since the drive signal at D only has to drive high-resistance inputs, the losses as a result of the potential isolator have a less pronounced effect.

Figure 5:
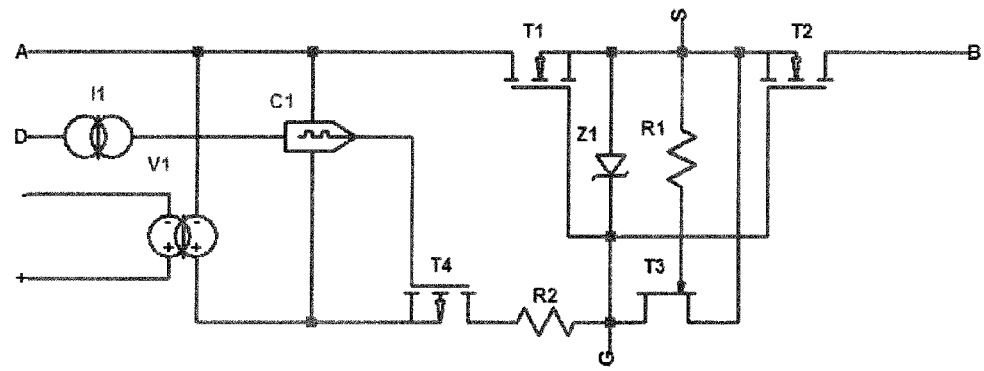
FIG. 5 shows a bidirectional MOSFET switch with a protective circuitry in accordance with one exemplary embodiment of the invention; and, FIG. 6 shows a bidirectional MOSFET switch including complementary transistors in comparison with FIG. 3 in accordance with another exemplary embodiment of the invention.

The circuit topology according to an exemplary embodiment of the invention may be supplemented in a simple manner by the customary snubbers comprising current-limiting resistors and voltage-limiting diodes, as is illustrated in FIG. 5. Such protective circuitries may also be used in the multiplexer shown in FIG. 4. In specific detail, a zener diode Z1 is connected between source S and gate G, and a resistor R1 is connected between sources and FET T3, and a resistor R2 is connected between the further MOSFET T4 and the FET T3 or gate G.

Figure 6:
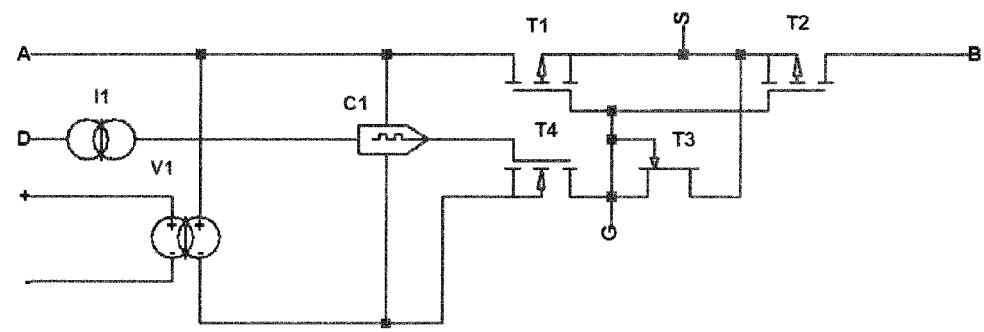

The circuit topology according to the an exemplary embodiment of the invention may be implemented using commercially available N- or P-channel MOSFET transistors as switching transistors T1 and T2; power or high-voltage transistors or HF transistors may also be used. FIG. 6 illustrates a complementary choice of transistors in comparison with FIG. 3. Such circuitry arrangements may also be used in the multiplexer shown in FIG. 4.

It is understood that the foregoing description is that of the preferred embodiments of the invention and that various changes and modifications may be made thereto without departing from the spirit and scope of the invention as defined in the appended claims.

What is claimed is:

1. A bidirectional MOSFET switch comprising:
   a first MOSFET transistor having a first source terminal, a first gate terminal and a first drain terminal;
   a second MOSFET transistor having a second source terminal, a second gate terminal and a second drain terminal;
   said first and second MOSFET transistors being connected to one another via said first and second source terminals and via said first and second gate terminals;
   an input terminal connected to said first drain terminal of said first MOSFET transistor;
   an output terminal connected to said second drain terminal of said second MOSFET transistor;
   a control unit;
   a potential isolator;
   a control input terminal connected to said control unit via said potential isolator;

said potential isolator being configured to galvanically isolate said control input terminal from said control unit;

a third FET transistor configured to generate, depending on a control current, a gate voltage Vgs between said first and second gate terminals and said first and second source terminals to switch said first and second MOSFET transistors;

a fourth MOSFET transistor;

said control unit being configured to switch the control current for said third FET transistor via said fourth MOSFET transistor; and, a floating voltage source galvanically connected to said input terminal and configured to generate a gate control current for said first and second MOSFET transistors.

2. The bidirectional MOSFET switch of claim 1, wherein, in order to switch on the first and second MOSFET transistors, the third FET transistor is configured to convert the control current into a gate-source voltage by a current saturation in a high-resistance state.

3. The bidirectional MOSFET switch of claim 1, wherein, in a state in which the control current does not flow, the third FET transistor is configured to connect the first and second gate terminals of the first and second MOSFET transistors to the first and second source terminals of the first and second MOSFET transistors at a low resistance in order to switch off said first and second MOSFET transistors.

4. The bidirectional MOSFET switch of claim 1, Wherein the floating voltage source is galvanically connected to one of the first and second drain terminals of the first and second MOSFET transistors.

5. The bidirectional MOSFET switch of claim 1, wherein the floating voltage source is a voltage supply for the control unit.

6. The bidirectional MOSFET switch of claim 1, wherein the floating voltage source is a current supply for the control unit.

7. The bidirectional MOSFET switch of claim 1, wherein the floating voltage source is configured to generate the control current in order to control the third FET transistor at a high resistance and to charge the gate capacitances of the first and second MOSFET transistors.

8. The bidirectional MOSFET switch as claimed in claim 1, wherein the control unit is configured to decode and store a switching state of the fourth MOSFET transistor.

9. The bidirectional MOSFET switch of claim 8, wherein said fourth MOSFET transistor is configured to switch the gate control current of the floating voltage source depending on a stored switching state of the control unit.

10. The bidirectional MOSFET switch of claim 1, wherein:
the first and second MOSFET transistors are N-channel type transistors, and
a negative potential of the floating voltage source is connected to one of the first and second drain terminals of one of said first and second MOSFET transistors.

11. The bidirectional MOSFET switch of claim 1, wherein:
the first and second MOSFET transistors are P-channel type transistors, and
a positive potential of the floating voltage source is connected to one of the first and second drain terminals of one of said first and second MOSFET transistors.

12. The bidirectional MOSFET of claim 1, wherein said fourth MOSFET transistor is a P-channel type transistor and said first and second MOSFET transistors are N-channel type transistors.

13. The bidirectional MOSFET of claim 1, wherein said fourth MOSFET transistor is an N-channel type transistor and said first and second MOSFET transistors are P-channel type transistors.

14. A multiplexer comprising at least two bidirectional MOSFET switches of claim 1, wherein the potential isolator and the floating voltage source are conjointly provided for each of the at least two bidirectional MOSFET switches.

* * * * *

UNITED STATES PATENT AND TRADEMARK OFFICE
CERTIFICATE OF CORRECTION

PATENT NO. : 10,020,805 B2
APPLICATION NO. : 15/179502
DATED : July 10, 2018
INVENTOR(S) : Hengl et al.

Page 1 of 1

It is certified that error appears in the above-identified patent and that said Letters Patent is hereby corrected as shown below:

In the Claims

In Column 7:
Line 28: delete "The bidirectional MOSFET switch of claim 1, Wherein" and substitute -- The bidirectional MOSFET switch of claim 1, wherein -- therefor.

Signed and Sealed this
Eleventh Day of September, 2018

Andrei Iancu
*Director of the United States Patent and Trademark Office*